United States Patent [19]
Staszewski et al.

[11] Patent Number: 6,037,886
[45] Date of Patent: Mar. 14, 2000

[54] METHOD AND APPARATUS FOR EXTRACTING BAND AND ERROR VALUES FROM DIGITAL SAMPLES OF AN ANALOG SIGNAL

[75] Inventors: Robert B. Staszewski, Garland; Gennady Feygin, Dallas, both of Tex.

[73] Assignee: Texas Instruments Incorporated, Dallas, Tex.

[21] Appl. No.: 09/053,867

[22] Filed: Apr. 1, 1998

[51] Int. Cl.[7] ..................................... H03M 1/62
[52] U.S. Cl. ............................ 341/139; 341/123
[58] Field of Search .................. 341/123, 122, 341/139

[56]                References Cited
            U.S. PATENT DOCUMENTS

| | | | |
|---|---|---|---|
| 5,438,460 | 8/1995 | Coker et al. | 341/139 |
| 5,796,358 | 8/1998 | Shih et al. | 341/139 |
| 5,808,573 | 9/1998 | Shih et al. | 341/110 |
| 5,866,842 | 3/1999 | Ziperovich | 360/51 |

*Primary Examiner*—Howard L. Williams
*Attorney, Agent, or Firm*—W. Daniel Swayze, Jr.; Wade James Brady, III; Richard L. Donaldson

[57] ABSTRACT

A read channel circuit (27) for a hard disk drive system (10) includes an analog-to-digital converter (38) having an output (39) which is supplied through a filter (41) to a detector (46) and to a band/error circuit (47). The band/error circuit extracts from the filter output a band value (48) and an error value (49). The band and error values are used by a timing recovery loop (51, 53) to control the operation of the analog-to-digital converter, and are used by a gain recovery loop (51, 54) to facilitate an automatic gain control function for an analog circuit (36). The band/error circuit uses targets and thresholds which are each a power of two, so that a predetermined number of the least significant bits from the output of the filter can be used as the error value, without modification. The band value is determined from the most significant bits of the output of the filter. The filter not only shapes the signal spectrum, but also performs an integer space transformation that normalizes the output of the analog-to-digital converter with respect to the predetermined targets and thresholds of the band/error circuit.

17 Claims, 4 Drawing Sheets

METHOD AND APPARATUS FOR EXTRACTING BAND AND ERROR VALUES FROM DIGITAL SAMPLES OF AN ANALOG SIGNAL

TECHNICAL FIELD OF THE INVENTION

This invention relates in general to a read channel circuit for a hard disk drive and, more particularly, to a band/error circuit which is part of such a read channel circuit and which extracts band and error values from equalized digital samples of an analog output signal from a read head.

BACKGROUND OF THE INVENTION

In a typical hard disk drive system, information read by a read head from a rotating magnetic disk is embodied in an analog signal which is supplied through a preamplifier to a read channel circuit. The read channel circuit includes an analog-to-digital converter circuit which periodically samples the analog signal, and which outputs successive digital samples that are supplied through a finite impulse response (FIR) filter to a digital detector circuit. The filter output is also supplied to a band/error circuit, which determines a band value and an error value for each filtered digital sample. The band and error values are used in feedback timing and gain recovery loops which adjust the timing and amplitude of the samples taken by the analog-to-digital converter circuit, so as to optimize the overall operation of the read channel circuit.

In the typical band/error circuit, a relatively complex subtracter circuit calculates the band value using all of the bits in the digital filter output, and a further relatively complex subtracter circuit calculates the error value using all of the bits in the digital filter output. Each subtracter circuit requires a number of arithmetic operations and clock cycles in order to calculate the band value or error value.

While band/error circuits of this type have been generally adequate for their intended purposes, they have not been satisfactory in all respects. For example, the two complex subtracter circuits each require a relatively significant amount of area in an integrated circuit, and consume a relatively significant amount of power. Further, the number of arithmetic operations and clock cycles required by each subtracter to calculate each band value or error value can create a time delay or latency which may affect the operation of the critical timing loop in which the band/error circuit is disposed, even to the point where stability of the operation of the overall read channel circuit may be affected. In addition, target and threshold levels in such a band/error circuit, which are used to determine the band and error values, are typically fixed or else require extra hardware in order to allow programmability.

SUMMARY OF THE INVENTION

From the foregoing, it may be appreciated that a need has arisen for a method and apparatus for extracting band/error values from a digital sample, in a manner which uses little or no hardware to extract each such value, and which thus minimizes the area and power consumption required in an integrated circuit. A further need is to reduce the latency required to extract each of the band and error values. A related need is to provide flexibility for adjustment of targets and thresholds used to extract the band and error values.

According to the present invention, a method and apparatus are provided to address this need, and involve: sampling an analog signal; generating a succession of digital values which each represent a respective sample; normalizing the digital values so that selected digital values which correspond to a predetermined threshold each have a normalized digital value which is substantially a power of two; generating a band value for each of the normalized digital values; and generating an error value for each of the normalized digital values by using a predetermined number of the least significant bits of each normalized digital value as the corresponding error value.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
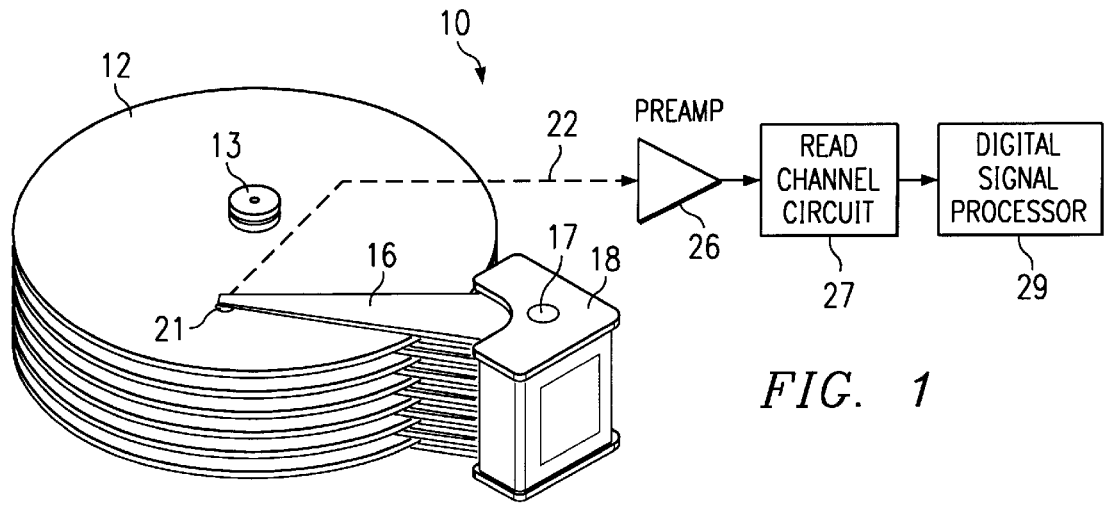
FIG. 1 is a diagrammatic view of a portion of a hard disk drive system which embodies the present invention.

FIG. 1 is a diagrammatic view of part of a hard disk drive system 10 which embodies the present invention. The system 10 includes a plurality of magnetic disks 12 which are fixedly secured to a spindle 13 that is rotationally driven by a not-illustrated spindle motor. A plurality of arms 16 are supported for pivotal movement about an axis defined by a pivot axle 17, pivotal movement of the arms 16 being effected under control of a voice coil motor 18. At the outer end of each arm is a read/write head 21. The head 21 includes respective portions which serve as a read head and a write head.

As shown diagrammatically at 22, the output of the read head is coupled to an input of a preamplifier 26. The output of the preamplifier 26 is coupled to an input of a read channel circuit 27, the output of which is coupled to an input of a digital signal processor 29. The read channel circuit 27 and the digital signal processor 29 may both be implemented in a single integrated circuit.

Figure 2:
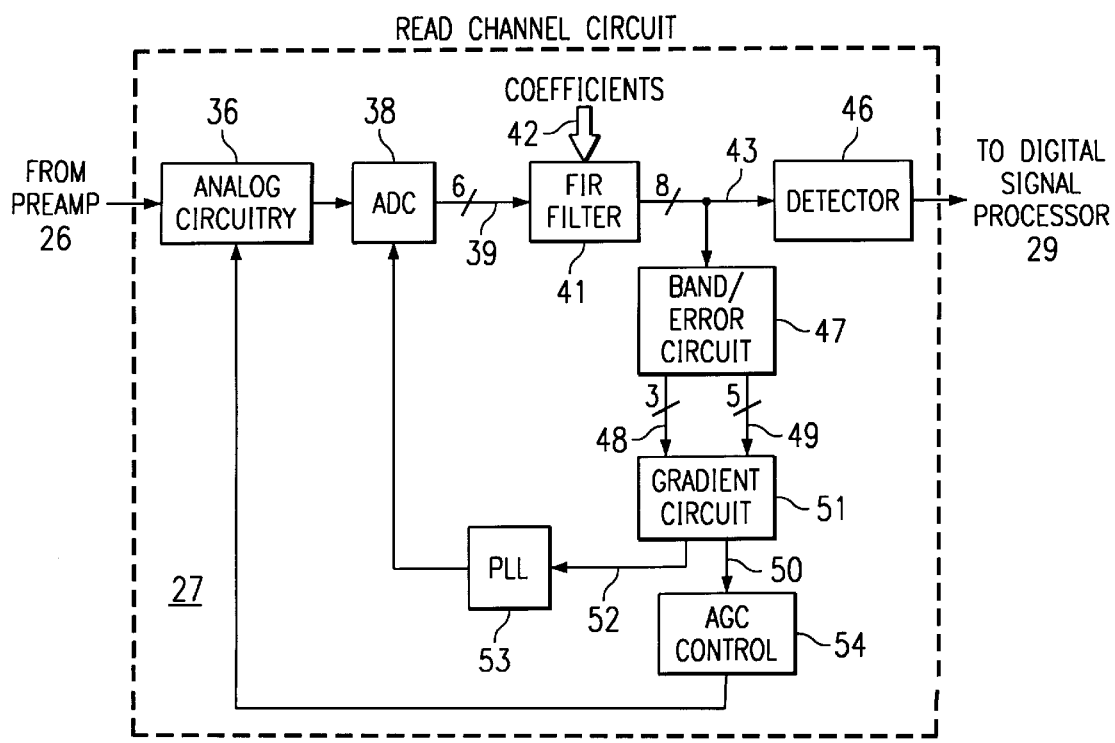
FIG. 2 is a block diagram of a read channel circuit which is a component of the hard disk drive system of FIG. 1, and which embodies the present invention.

In the disclosed embodiment, the read channel circuit 27 is a Partial Response Maximum Likelihood (PRML) system. FIG. 2 is a diagrammatic view of the circuitry within the read channel circuit 27. In particular, the read channel circuit 27 includes analog circuitry 36, which has an input coupled to the output of the preamplifier 26. The analog circuitry 36 includes automatic gain control (AGC) circuitry, which is not separately illustrated. The output of the analog circuitry 36 is coupled to an input of an analog-to-digital converter (ADC) circuit 38, the ADC 38 producing a 6-bit digital output at 39.

The output 39 of the ADC 38 is coupled to the input of a finite impulse response (FIR) filter 41, which also receives two or more coefficients at 42. The coefficients define operational characteristics of the filter 41, as described in more detail later. The filter 41 produces at 43 an 8-bit digital output. A detector 46 has an input which receives the output 43 of the filter 41, and has an output which is coupled to the digital signal processor 29 (FIG. 1), usually through some additional circuitry provided within the read channel circuit 27. For example, decoding circuitry is usually provided in the read channel circuit 27 between the detector 46 and the digital signal processor 29.

The output 43 of the filter 41 is also supplied to a band/error circuit 47, which extracts band and error information from the filter output 43 in a manner described in more detail later. The circuit 47 outputs at 48 a 3-bit digital signal representing a band value, and outputs at 49 a 5-bit digital signal representing an error value. The band and error values at 48 and 49 are each supplied to a gradient circuit 51. The gradient circuit 51 has a timing gradient output 50 which is supplied to a phase locked loop (PLL) 53. The PLL 53 has an output which is coupled to an input of the ADC 38. The PLL 53 facilitates timing recovery by ensuring that the ADC 38 samples the analog output signal from the analog circuitry 36 at points in time which optimize the operation of the read channel circuit 27.

The gradient circuit 51 also has a gain gradient output 52, which is coupled to an AGC control circuit 54, the output of which is coupled to the analog circuitry 36. The AGC control circuit 54 facilitates gain recovery, in particular by controlling an AGC circuit located within the analog circuitry 36, so as to optimize the operation of the read channel circuit 27.

Figure 3:
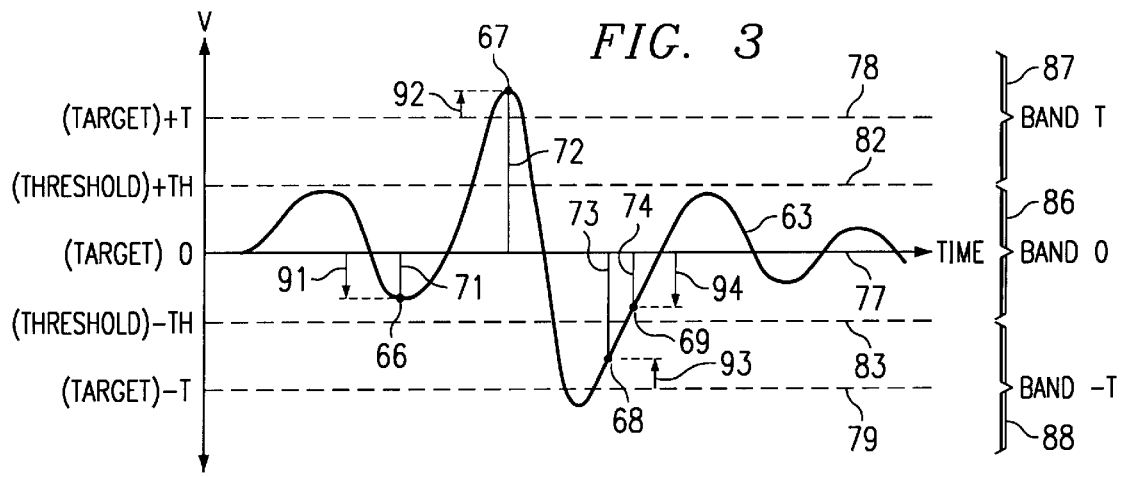
FIG. 3 is a graph of an analog signal supplied to the read channel circuit of FIG. 2, and shows various ways in which samples of the analog signal can be digitally represented.

FIG. 3 is a graph depicting an analog signal 63 of a type which might be supplied by the analog circuitry 36 to the input of the ADC 38. Reference numerals 66–69 designate four sample points on the curve of the analog signal 63. It will be recognized that the ADC 38 would actually sample the signal 63 at a much larger number of points. The sample points 66–69 are thus a small subset of the actual sample points, which have been selected for discussion in order to facilitate an understanding of the present invention.

Upon sampling the signal 63 at each of the four sample points 66–69, the ADC 38 outputs at 39 a 6-bit digital value, which is a two's complement number representing a positive or negative magnitude associated with the sample point. Each such digital value from the ADC 38 is defined with respect to a reference of 0 volts. For example, with respect to the sample point 66, the ADC 38 would output a two's complement number representing a negative magnitude 71. For the sample point 67, it would output a two's complement number representing a positive magnitude 72. Similarly, for sample points 68 and 69, it would output two's complement numbers representing negative magnitudes 73 and 74.

Assume that the reference level of 0 volts is selected as a first target 77, that a positive voltage level +T is selected as a second target 78, and that a substantially equal negative voltage level -T is selected as a third target 78. Assume also that a positive voltage level +TH which is one-half the level of target 78 is selected to be a positive threshold 82, and that a negative voltage level -TH which is one-half the level of target -T is selected to be a negative threshold 83. A first band 86 (BAND 0) is defined to be the region between the thresholds 82 and 83, a second band 87 (BAND T) is defined to be the region above the threshold 82, and a third band 88 (BAND -T) is defined to be the region below threshold 83. Each of the bands 86–88 is centered around a respective one of the targets 77–79.

Instead of expressing each of these sample points 66–69 as a positive or negative magnitude, as at 71–74, each of these four sample points can alternatively be defined by specifying the band within which it is located, in combination with an error value representing the distance of that sample point from the respective target level associated with the specified band. For example, as evident from FIG. 3, the point 66 is disposed within band 86, and has an error value which is a negative magnitude 91 relative to the target level 77 for the band 86. Similarly, the point 67 is in band 87, and has an error value which is a positive magnitude 92 with respect to the target level 78 for band 87. Likewise, the points 68 and 69 are respectively disposed in bands 88 and 86, and have respective error values 93 and 94 relative to the target levels 79 and 77 for the bands 88 and 86.

The function of the band/error circuit 47 (FIG. 2) is to take the positive or negative magnitude associated with a given sample, and then generate the band and error values for that sample. With reference to FIG. 2, it is important to recognize that the filter 41 processes each sample generated by the ADC 38 before that sample reaches the band/error circuit 47. For simplicity, and to facilitate comprehension of the present invention, FIG. 3 has been prepared to reflect a situation in which the coefficients 42 of the filter 41 are selected so that the filter 41 does not alter the samples produced by the ADC 38. In a normal operational system, of course, the filter 41 will process each sample from the ADC 38 before the sample is presented to the band/error circuit 47. Nevertheless, FIG. 3 facilitates an understanding of how samples can be converted so as to be represented in the form of band and error values.

Figure 4:
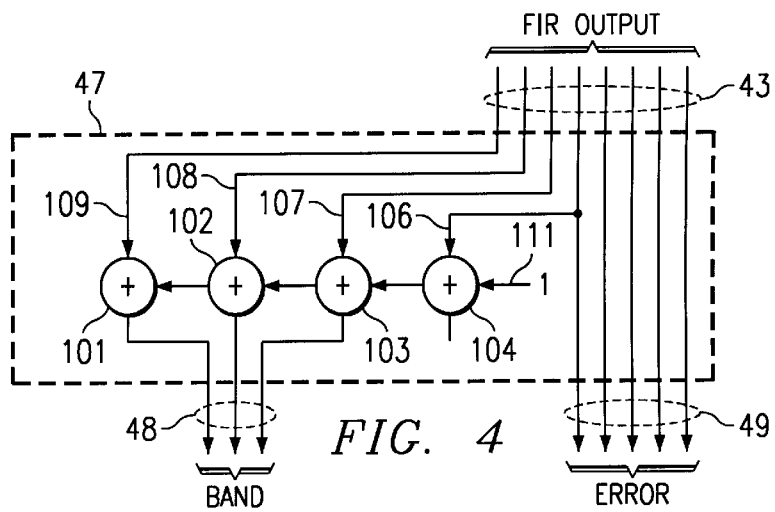
FIG. 4 is a block diagram of a band/error circuit which is a component of the read channel circuit of FIG. 2.

FIG. 4 provides a more detailed view of the band/error circuit 47. In FIG. 4, the five least significant bits of the 8-bit digital output 43 of the FIR filter 41 are directly used as the error value 49, without modification. The four most significant bits of the filter output 43 are supplied to respective adders 101–104. More specifically, line 106 is the least significant of the four most significant bits, and is coupled to an input of adder 104, which also has its carry in enabled at 111. The carry out for adder 104 is coupled to the carry in of adder 103, which receives the next most significant filter output line 107. The carry out of adder 103 is coupled to the carry in of adder 102, which also receives the next most significant filter output line 108. The carry out of adder 102 is coupled to the carry in of adder 101, which receives the most significant line 109 of the filter output. The output of adder 104 is unused. The outputs of adders 101–103 serve as the 3-bit band value 48.

Figure 5:
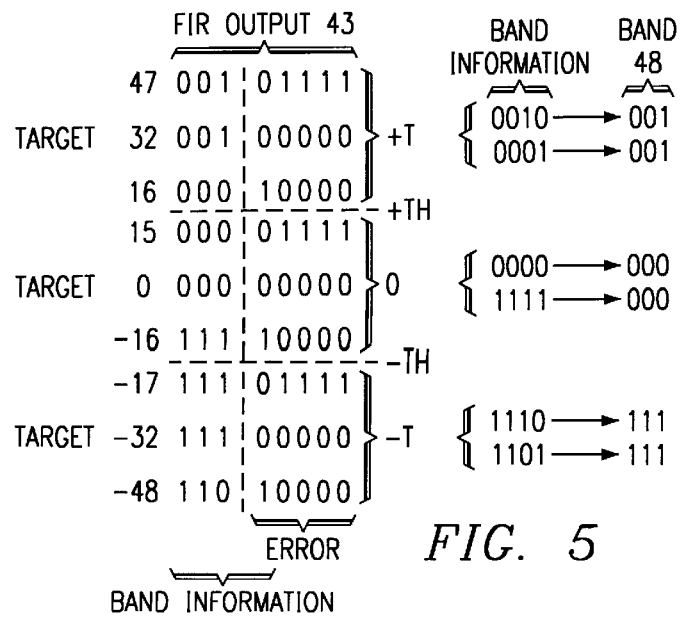
FIG. 5 is a diagram representing certain operational characteristics of the band/error circuit of FIG. 4.

The operation of the band/error circuit 47 of FIG. 4 is illustrated diagrammatically in FIG. 5. As evident from FIG. 5, a first target has been selected to be zero, a second target has been selected to be +32, and a third target has been selected to be -32. Thus, these targets are each a power of two ($2^5$). Further, a positive threshold +TH has been selected so that 15 is in one band and 16 is in another band, and the negative threshold -TH has been selected so that -16 is in one band and -17 is in another band. Thus, these thresholds are each substantially a power of two ($2^4$). As a result, the five least significant bits of the output 43 from the filter 41 may be directly used as the error value because, relative to the target level for each band, they inherently represent a two's complement number ranging from −16 (binary 10000) through 0 (binary 00000) to positive 15 (binary 01111).

The band information is derived from the four most significant bits of the filter output, as shown in the right portion of FIG. 5. In particular, in BAND 0, the four most significant bits always have the binary value of either "0000" or "1111", both of which are to be converted into a 3-bit binary code "000" identifying this band. In BAND +T, these four most significant bits are either "0010" or "0001", both of which are to be converted into a 3-bit binary code "001" identifying this band. Similarly, in BAND −T, these four most significant bits are always "1110" or "1101", both of which are to be converted into a 3-bit code "111" identifying this band. The adders 101–104 in FIG. 4, in response to the four most significant bits of the FIR filter output 43, generate one of these three band identifying codes or values "000", "001" and "111".

Figure 6:
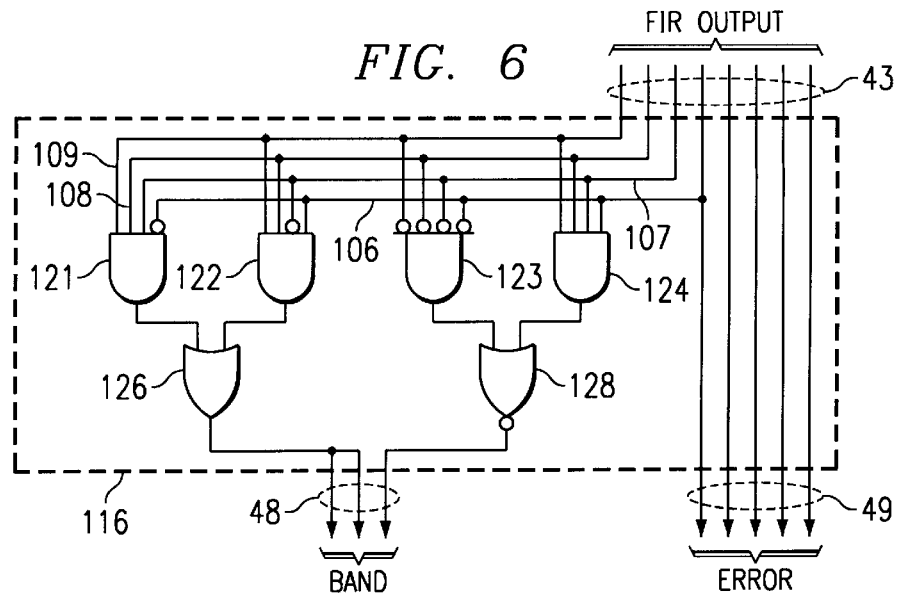
FIG. 6 is a band/error circuit which is an alternative embodiment of the band/error circuit of FIG. 4.

FIG. 6 is a schematic circuit diagram of a band/error circuit 116, which is an alternative embodiment of the band/error circuit 47 shown in FIG. 4. The circuit 116 is functionally equivalent to the circuit 47, and can be substituted for the circuit 47 in the read channel circuit 27 of FIG. 2. The band/error circuit 116 of FIG. 6 uses combinational logic to extract the band value 48 from the FIR filter output 43. In particular, the circuit 116 has four four-input AND gates 121–124. The gate 121 activates its output when the four most significant bits 106–109 of the FIR output 43 have the binary value "1110". The gate 122 detects the binary value "1101", the gate 123 detects the binary value "0000", and the gate 124 detects the binary value "1111". The outputs of the gates 121 and 122 are connected to respective inputs of a two-input OR gate 126, the output of which controls both of the two most significant bits of the band value 48. The outputs of the gates 123 and 124 are coupled to respective inputs of a two-input NOR gate 128, the output of which serves as the least significant bit of the 3-bit band value 48.

It is a feature of the present invention that, with reference to FIGS. 4–6, the five least significant bits of the FIR output 43 can be directly used as the 5-bit error value 49, without modification. This avoids the need to provide circuitry to calculate the error value. However, it also requires that the positive and negative thresholds +TH and −TH each be selected to be a number which is a power of two. With reference to FIG. 2, the output of the ADC 38 may need to be scaled in order to ensure that the digital value for a sample that corresponds to one of the thresholds is in fact presented to the band/error circuit as a binary number which is a power of two. In the disclosed embodiment, the FIR filter 41 is used to effect any necessary scaling.

Figure 7:
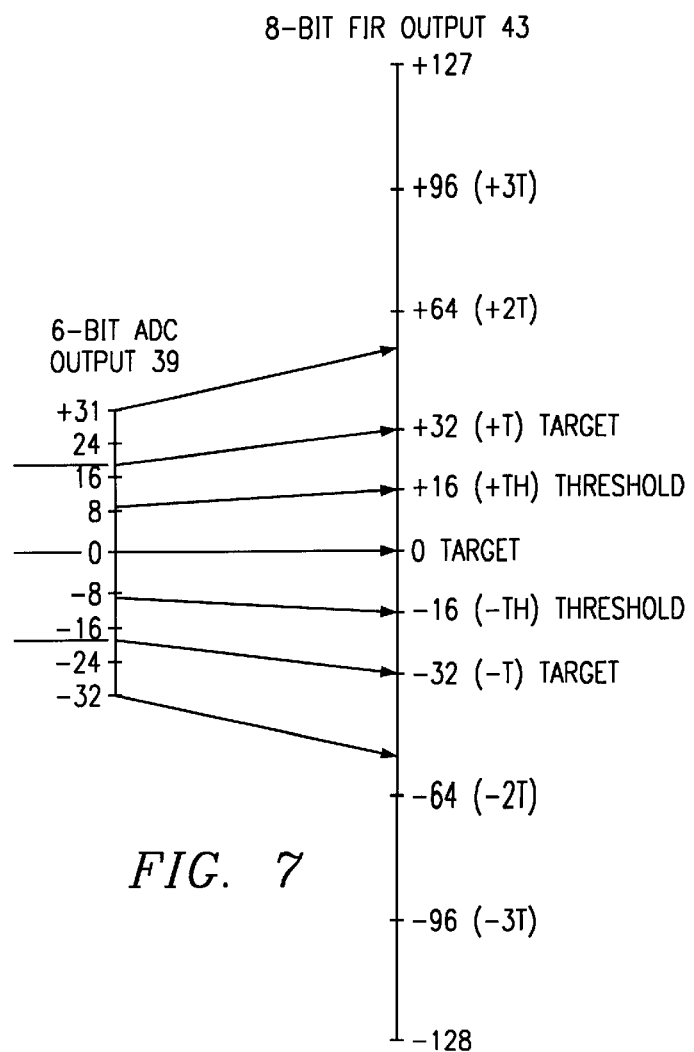
FIG. 7 is a diagram which provides a graphical representation of an integer transformation or scaling function carried out by a finite impulse response filter which is a component of the read channel circuit of FIG. 2.

More specifically, FIG. 7 is a diagrammatic representation of the scaling function implemented by the filter 41. The vertical line at the left side of FIG. 7 represents the 6-bit digital output of the ADC 38, or in other words a digital number ranging from −32 to +31. The vertical line at the right side of FIG. 7 represents the 8-bit digital output 43 of the FIR filter 41, or in other words a number ranging from −128 to +127. The inclined lines or arrows extending from the left vertical line to the right vertical line represent the scaling function carried out by the filter 41, in particular so that digital values from the ADC 38 which correspond to one of the target levels will map to either +32 (target +T) or −32 (target −T). Digital values from the ADC 38 which correspond to one of the thresholds will thus map to +16 (threshold +TH) or −16 (threshold −TH). In the disclosed embodiment, the scaling is linear.

Figure 8:
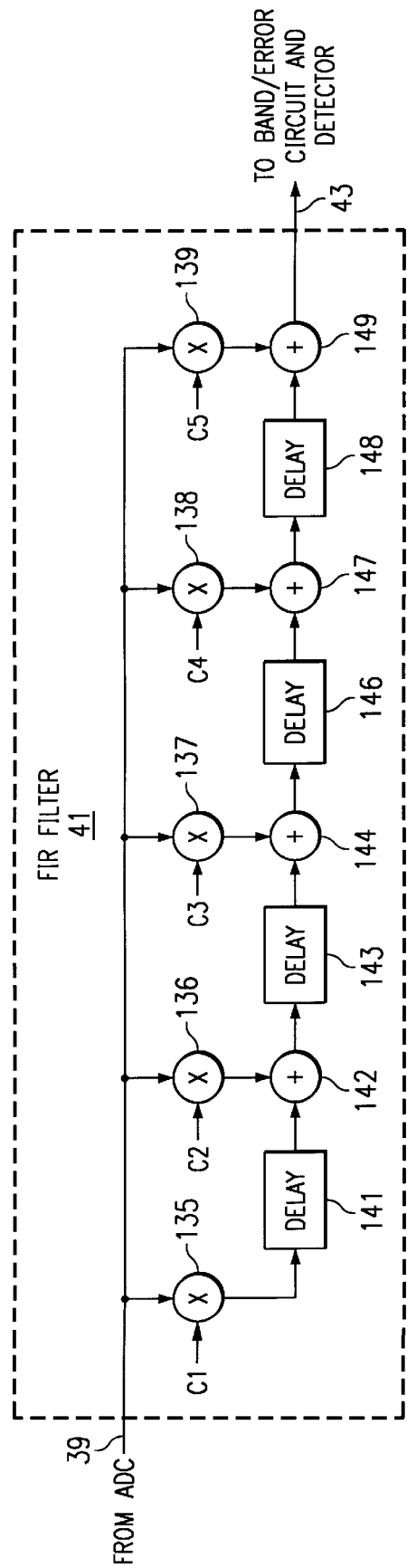
FIG. 8 is a block diagram of the finite impulse response filter of FIG. 2.

The manner in which the scaling is effected will now be explained in more detail, with reference to FIG. 8. FIG. 8 is a diagrammatic view of the circuitry within the FIR filter 41 of FIG. 2. More specifically, the filter 41 includes five digital multipliers 135–139, each of which receives the 6-bit digital output 39 from the ADC 38, and then multiplies it by a respective digital coefficient C1, C2, C3, C4 or C5. The five coefficients C1–C5 are the same coefficients which are collectively identified in FIG. 2 with reference number 42.

The output of multiplier 135 is coupled to the input of a delay circuit 141, which effects a unitary delay. That is, the delay circuit 141 effects a time delay which is equal to the time interval between consecutive samples digitized by the ADC 38. The output of the delay circuit 141 is coupled to one input of an adder 142, the other input of which receives the output of the multiplier 136. The output of adder 142 is coupled to the input of a further unitary delay circuit 143. The output of delay circuit 143 is coupled to one input of a further adder 144, the other input of which receives the output of multiplier 137. The output of adder 144 is coupled to an input of a further unitary delay circuit 146. The output of delay circuit 146 is coupled to an input of another adder 147, the other input of which receives the output of multiplier 138. The output of adder 147 is coupled to the input of yet another unitary delay circuit 148. The output of delay circuit 148 is coupled to an input of another adder 149, the other input of which receives the output of multiplier 139. The output of adder 149 serves as the 8-bit output 43 of the FIR filter 41.

In order to effect the scaling function discussed above in association with FIG. 7, the coefficients C1–C5 of the filter 41 are all selected to have appropriate values. In order to change the scaling function, the coefficients C1–C5 are all linearly adjusted by the same factor. It will thus be recognized that, in the disclosed embodiment, the FIR filter 41 is used not only for the traditional function of shaping the signal spectrum to a specified PRML target, but also for the additional function of performing an integer space transformation which facilitates extraction of the error and band information by the circuit 47.

The present invention provides a number of technical advantages. One such technical advantage is that the band/error circuit can extract the error value without using any hardware at all. This saves area and power consumption in an integrated circuit. Moreover, it eliminates the latency of several clock cycles required in a known circuit to arithmetically calculate the error value. A further technical advantage is that only a minimal amount of circuitry is required to extract the band value. This also contributes to reduced area and power consumption in an integrated circuit. Further, it reduces the latency required to extract the band information, because the band information can be extracted by a simple adder circuit or a simple combinational logic circuit, in fewer clock cycles than known circuits.

A further advantage is more stable operation of the read channel circuit, because the extraction of band and error information is part of a critical timing recovery loop, and reducing the latency required to extract the band and error information increases the stability of the operation of this real-time loop. Yet another technical advantage is that the pre-normalized target levels can be easily changed, by simply changing the coefficients of the FIR filter.

Although one embodiment has been illustrated and described in detail, it should be understood that various changes, substitutions and alterations can be made therein without departing from the scope of the present invention. For example, the disclosed embodiment involves a PRML read channel circuit, but it will be recognized that the present invention could be utilized in other types of circuits where band and error information must be extracted from digital values. As another example, the disclosed embodiment uses certain specified powers of two for the target levels and threshold levels, but it will be recognized that other powers of two could alternatively utilized. The disclosed embodiment also uses three bands for purposes of determining band and error information, but it will be recognized that it would be possible to use a larger or smaller number of bands.

In addition, the present application discloses two different embodiments for implementing the band/error circuit, but it will be recognized that there are still other ways of implementing the band/error circuit in accord with the present invention. The disclosed embodiment also uses the FIR filter not only to shape the signal spectrum, but also to perform an integer space transformation or scaling, but it will be recognized that the transformation or scaling could alternatively be carried out by some other circuit or in some other manner.

It should also be recognized that direct connections disclosed herein could be altered, such that two disclosed components or elements would be coupled to one another through an intermediate device or devices without being directly connected, while still realizing the present invention. Other changes, substitutions and alterations are also possible without departing from the spirit and scope of the present invention, as defined by the following claims.

What is claimed is:

1. An apparatus, comprising:

an analog-to-digital converter which is operable to sample an analog input signal and to output successive sample levels as respective digital values;

a normalizing circuit which is operable to normalize said digital values representing the sample levels so that selected said digital values corresponding to a predetermined sample level threshold each have a normalized digital value which is substantially a power of two; and a band/error circuit which is operable to generate a band value and an error value for each of said normalized digital values, said band/error circuit using a predetermined number of the least significant bits of each said normalized digital value as the error value therefor.

2. An apparatus according to claim 1, including a filter circuit coupled between said analog-to-digital converter and said band/error circuit, said normalizing circuit being integrally disposed within said filter circuit.

3. An apparatus according to claim 2, wherein said filter circuit effects a filtering function which is operationally defined by a plurality of coefficients, and wherein the normalizing of said digital values is effected by selection of said coefficients.

4. An apparatus according to claim 1, including a hard disk drive having a read head and having a read channel circuit which has an input coupled to an output of said read head, said read channel circuit having therein said analog-to-digital converter, said normalizing circuit, and said band/error circuit.

5. An apparatus according to claim 1, wherein said band/error circuit is operable to generate said band value from a predetermined number of the most significant bits of each said normalized digital value.

6. An apparatus according to claim 1, wherein said band/error circuit includes adder circuitry which is operative to generate the band value for each said normalized digital value from a predetermined number of the most significant bits thereof.

7. An apparatus according to claim 1, wherein said band/error circuit includes combinational logic circuitry which is operative to generate the band value for each said normalized digital value from a predetermined number of the most significant bits thereof.

8. A hard disk drive apparatus, comprising a rotating magnetic disk having information magnetically stored thereon, a read head supported adjacent said disk and operative to read information from said disk and to output an analog signal embodying the information, and a read channel circuit which has an input coupled to the analog signal; said read channel circuit including:

an analog-to-digital converter which is operable to sample the analog signal and to output successive sample levels as respective digital values;

a normalizing circuit which is operable to normalize said digital values representing the sample levels so that selected said digital values corresponding to a predetermined sample level threshold each have a normalized digital value which is substantially a power of two; and a band/error circuit which is operable to generate a band value and an error value for each of said normalized digital values, said band/error circuit using a predetermined number of the least significant bits of each said normalized digital value as the error value therefor.

9. An apparatus according to claim 8, including a filter circuit coupled between said analog-to-digital converter and said band/error circuit, said normalizing circuit being integrally disposed within said filter circuit.

10. An apparatus according to claim 9, wherein said filter circuit effects a filtering function which is operationally defined by a plurality of coefficients, and wherein the normalizing of said digital values is effected by selection of said coefficients.

11. An apparatus according to claim 8, wherein said band/error circuit is operable to generate said band value from a predetermined number of the most significant bits of each said normalized digital value.

12. An apparatus according to claim 8, wherein said band/error circuit includes adder circuitry which is operative to generate the band value for each said normalized digital value from a predetermined number of the most significant bits thereof.

13. An apparatus according to claim 8, wherein said band/error circuit includes combinational logic circuitry which is operative to generate the band value for each said normalized digital value from a predetermined number of the most significant bits thereof.

14. A method comprising the steps of:

sampling an analog signal;

generating a succession of digital values which each represent a respective sample level;

normalizing said digital values representing the sample levels so that selected said digital values which correspond to a predetermined sample level threshold each have a normalized digital value which is substantially a power of two;

generating a band value for each of said normalized digital values; and generating an error value for each of said normalized digital values by using a predetermined number of the least significant bits of each said normalized digital value as the error value therefor.

15. A method according to claim 14, including between said steps of generating said succession of digital values and generating a band value, the step of carrying out a filtering function on said digital values representing the sample levels, said normalizing step being carried out as part of said filtering step.

16. A method according to claim 14, including the step of using an output signal from a read head of a hard disk drive system as the analog signal for said sampling step.

17. A method according to claim 14, wherein said step of generating the band value is carried out by deriving the band value from a predetermined number of the most significant bits of each said normalized digital value.

* * * * *